United States Patent
Choi et al.

(10) Patent No.: US 9,262,266 B2
(45) Date of Patent: Feb. 16, 2016

(54) NONVOLATILE MEMORY DEVICES WITH AGE-BASED VARIABILITY OF READ OPERATIONS AND METHODS OF OPERATING SAME

(71) Applicants: JinHyeok Choi, Yongin-si (KR); Hwaseok Oh, Yongin-si (KR)

(72) Inventors: JinHyeok Choi, Yongin-si (KR); Hwaseok Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/201,170

(22) Filed: Mar. 7, 2014

(65) Prior Publication Data
US 2014/0189469 A1 Jul. 3, 2014

Related U.S. Application Data

(63) Continuation of application No. 13/033,276, filed on Feb. 23, 2011, now Pat. No. 8,694,852.

(30) Foreign Application Priority Data

Feb. 24, 2010 (KR) .................... 10-2010-0016724

(51) Int. Cl.
G11C 29/00 (2006.01)
G06F 11/10 (2006.01)
G11C 16/34 (2006.01)

(52) U.S. Cl.
CPC ........ G06F 11/1072 (2013.01); G06F 11/1048 (2013.01); G11C 16/349 (2013.01)

(58) Field of Classification Search
CPC ............ G06F 11/1072; G06F 11/1076; G06F 11/1008
See application file for complete search history.

(56) References Cited

U.S. PATENT DOCUMENTS

| | | | |
|---|---|---|---|
| 5,784,356 A | 7/1998 | Hayashi et al. | |
| 6,212,659 B1 | 4/2001 | Zehavi | |
| 6,266,276 B1 * | 7/2001 | Odani | 365/185.18 |
| 6,483,752 B2 * | 11/2002 | Hirano | 365/185.33 |
| 6,651,212 B1 | 11/2003 | Katayama et al. | |
| 6,714,262 B1 | 3/2004 | Tsurumi | |
| 6,850,443 B2 | 2/2005 | Lofgren et al. | |
| 6,992,932 B2 | 1/2006 | Cohen | |
| 7,224,607 B2 * | 5/2007 | Gonzalez et al. | 365/185.11 |
| 7,450,425 B2 | 11/2008 | Aritome | |
| 7,646,636 B2 | 1/2010 | Kim | |
| 7,764,550 B2 | 7/2010 | Suhail et al. | |
| 7,800,952 B2 | 9/2010 | Lee | |
| 7,804,718 B2 | 9/2010 | Kim | |

(Continued)

FOREIGN PATENT DOCUMENTS

| | | |
|---|---|---|
| JP | 08-287607 | 11/1996 |
| JP | 2002-032959 | 1/2002 |

(Continued)

*Primary Examiner* — Esaw Abraham
(74) *Attorney, Agent, or Firm* — Myers Bigel Sibley & Sajovec, PA

(57) ABSTRACT

Integrated circuit memory systems and methods include comparing a number of erase cycles of a memory block corresponding to a read request to a first value and reading data stored in the memory block according to a first read condition corresponding to a first reliability improvement operation when the number of erase cycles of the memory block is less than the first value. An error of the data read according to the first read condition may be corrected using an error correction code (ECC) when the error of the data read according to the first read condition is correctable.

20 Claims, 11 Drawing Sheets

(56) References Cited

U.S. PATENT DOCUMENTS

| | | | |
|---|---|---|---|
| 7,872,918 B2 * | 1/2011 | Jang et al. | 365/185.2 |
| 7,945,825 B2 | 5/2011 | Cohen et al. | |
| 7,975,193 B2 * | 7/2011 | Johnson | 714/723 |
| 7,983,090 B2 * | 7/2011 | Aritome | 365/185.22 |
| 8,000,149 B2 | 8/2011 | Lee | |
| 8,045,377 B2 | 10/2011 | Kim | |
| 8,130,544 B2 * | 3/2012 | Chou et al. | G06F 11/1048 365/185.02 |
| 8,194,454 B2 | 6/2012 | Doyle | |
| 8,339,865 B2 | 12/2012 | Lavan et al. | |
| 8,448,046 B2 * | 5/2013 | Hung | 714/768 |
| 8,527,839 B2 * | 9/2013 | Hung et al. | 714/764 |
| 8,687,419 B2 * | 4/2014 | Park | 365/185.03 |
| 2002/0108090 A1 | 8/2002 | Ariel et al. | |
| 2004/0015649 A1 * | 1/2004 | Chang | 711/103 |
| 2006/0007801 A1 | 1/2006 | Takashima | |
| 2006/0181929 A1 | 8/2006 | Kotani et al. | |
| 2009/0106482 A1 | 4/2009 | Sarin et al. | |
| 2009/0210776 A1 | 8/2009 | Cho et al. | |
| 2011/0252289 A1 * | 10/2011 | Patapoutian et al. | 714/763 |

FOREIGN PATENT DOCUMENTS

| | | |
|---|---|---|
| JP | 2002-230779 | 8/2002 |
| JP | 2005-012557 | 1/2005 |
| JP | 2006-228277 | 8/2006 |
| JP | 100859258 B1 | 9/2008 |
| KR | 100236379 B1 | 12/1999 |
| KR | 1020040040714 A | 5/2004 |
| KR | 20070114532 A | 12/2007 |
| KR | 100859258 B1 | 9/2008 |

* cited by examiner

NONVOLATILE MEMORY DEVICES WITH AGE-BASED VARIABILITY OF READ OPERATIONS AND METHODS OF OPERATING SAME

REFERENCE TO PRIORITY APPLICATION

This application is a continuation of U.S. patent application Ser. No. 13/033,276, filed Feb. 23, 2011, now U.S. Pat. No. 8,694,852, and claims priority to Korean Patent Application No. 10-2010-0016724, filed Feb. 24, 2010, the contents of which are hereby incorporated herein by reference.

FIELD

The present disclosure relates to semiconductor memory devices and, more specifically, an access method of a memory system including a nonvolatile memory device and a memory controller.

BACKGROUND

Semiconductor memory devices are memory devices that are made of semiconductors materials such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Volatile memory devices include static random access memory (SRAM) and dynamic random access memory (DRAM). Nonvolatile memory devices retain their stored data even when their power supplies are interrupted. Nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM). Flash memory devices are categorized as two types, i.e., NOR type and NAND type.

In the early stage, a flash memory device can store two states (1 bit) in a single memory cell. With the advance in technology, two bits or more can be stored in a single memory cell. That is, a multi-media cell (MLC) technology has been developed to store more data in a limited cell. However, with the shrinkage of processes, sizes of memory cells are reduced and coupling between the memory cells is increased, which can deteriorate dispersion characteristics of the memory cells and increase non-uniformity of the memory cells. In addition, if program/erase operations are repeated, dispersion characteristics of the memory cells are further degraded and may limit lifetime of a flash memory.

SUMMARY

According to some embodiments of the invention, an access method of a memory system includes comparing a number of erase cycles of a memory block corresponding to a read request to a first value, reading data stored in the memory block according to a first read condition corresponding to a first reliability improvement operation when the number of erase cycles of the memory block is less than the first value, and correcting an error of the data read according to the first read condition using an error correction code (ECC) when the error of the data read according to the first read condition is correctable.

According to some embodiments, an access method of a memory system includes comparing a number of erase cycles of a memory block corresponding to a read request to a first value, reading data stored in the memory block according to a first read condition corresponding to a first reliability improvement operation when the number of erase cycles of the memory block is less than the first value, comparing the number of erase cycles of the memory block to a second value that is greater than the first value when the number of erase cycles of the memory block is greater than the first value, reading the data stored in the memory block according to a second read condition corresponding to a second reliability improvement operation when the number of erase cycles of the memory block is greater than the first value and less than the second value, and reading the data stored in the memory block according to a third read condition corresponding a third reliability improvement operation when the number of erase cycles of the memory block is greater than the second value.

According to some embodiments, a memory system includes a processor and a nonvolatile memory coupled to the processor and comprising computer readable program code embodied in the nonvolatile memory that when executed by the processor causes the processor to perform operations. The operations may include comparing a number of erase cycles of a memory block corresponding to a read request to a first value, reading data stored in the memory block according to a first read condition corresponding to a first reliability improvement operation when the number of erase cycles of the memory block is less than the first value, and reading the data stored in the memory block according to a second read condition corresponding to a second reliability improvement operation when the error of the data read according to the first read condition is not correctable.

BRIEF DESCRIPTION OF THE DRAWINGS

Embodiments of the inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION

The inventive concept will now be described more fully hereinafter with reference to the accompanying drawings, in which preferred embodiments of the inventive concept are shown. However, the inventive concept may be embodied in many different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

A nonvolatile memory device and a memory system including the same will be used as examples to describe the advantages and features of the inventive concept. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept.

Figure 1:
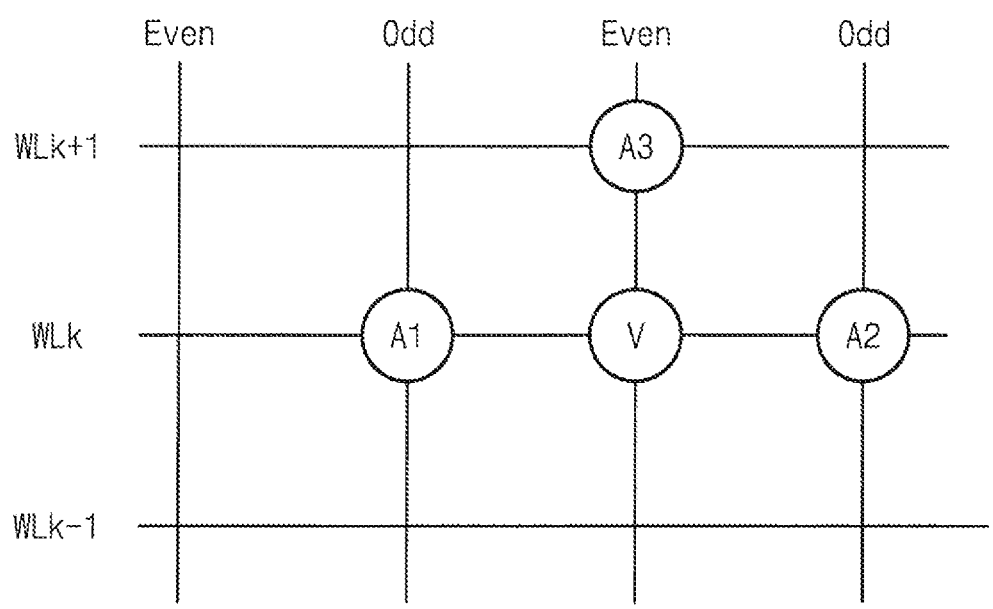
FIG. 1 illustrates an affect resulting from coupling of peripheral memory cells.

FIG. 1 illustrates an affect resulting from coupling of peripheral memory cells. Referring to FIG. 1, a memory cell V is affected by coupling of peripheral memory cells A1, A2, and A3. The coupling causes threshold voltage distribution characteristics of the memory cell V to be deteriorated. As the threshold voltage distribution characteristics are deteriorated, stored data may be changed. As a result, reliability of a nonvolatile memory device can be degraded. Moreover, physical characteristics of a memory cell may be varied with the repetition of program/erase operations. Due to the variation in the physical characteristics of a memory cell, the memory cell encounters a reliability-related problem.

In order to overcome the above-mentioned disadvantages, data stored in peripheral memory cells are referred to during a read operation of a memory cell. A read method of a read-target memory cell is determined with reference to the data stored in peripheral memory cells. For example, a data error may be compensated by changing the magnitude of a read voltage or repeatedly reading a memory cell. This operation may be referred to as a reliability improvement operation. Due to the reliability improvement operation, reliability of the nonvolatile memory device may be improved.

Figure 2:
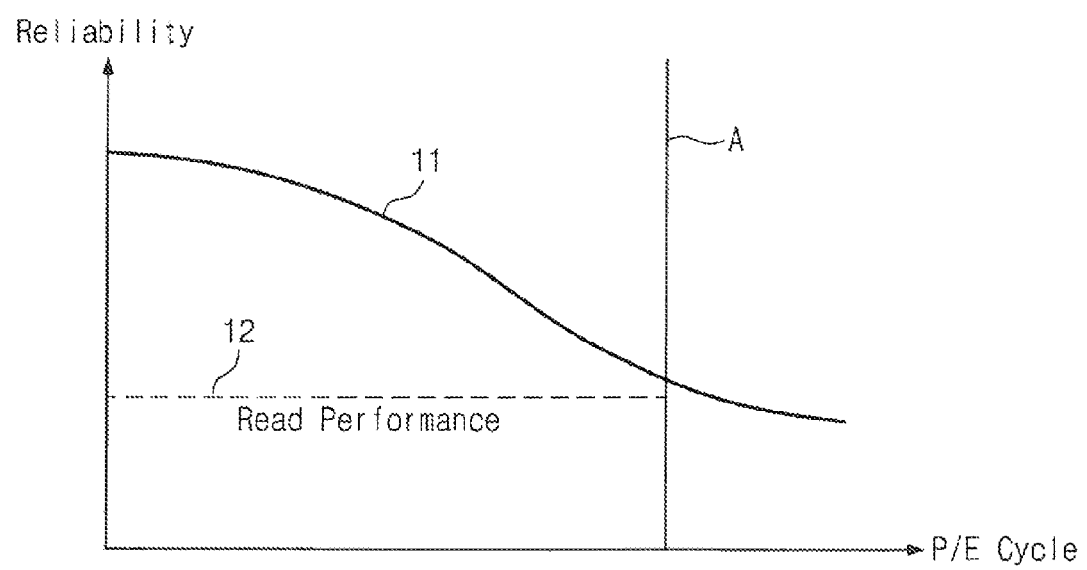
FIG. 2 is a graphic diagram illustrating change of reliability and read performance depending on a program/erase cycle.

FIG. 2 is a graphic diagram illustrating change of reliability and read performance depending on a program/erase cycle. Referring to FIG. 2, reliability of a nonvolatile memory device is lowered as program/erase operations are repeatedly performed. This is, as described above with reference to FIG. 1, because physical characteristics of a memory cell may be varied. Generally, reliability of a nonvolatile memory device is lowered with the increase of a program/erase cycle. In contrast, read conditions are determined to ensure maximum lifetime. For example, if a program/erase cycle of a nonvolatile memory device is limited to 5000, initial read conditions are established to solve a reliability problem which occurs in the case that program/erase operations are practically performed 5000 times ("A"). The initial read conditions continue to be applied until the program/erase cycle of the nonvolatile memory device reaches a limited count. Thus, as shown in FIG. 2, read performance is constantly maintained.

A lifetime limit of a nonvolatile memory device is determined with reference to a program/erase cycle. Accordingly, a memory system performs a reliability improvement operation until a program/erase cycle reaches a limited program/erase cycle. Disadvantageously, reading time increases because a reliability improvement operation is always performed even when characteristics of a memory cell are good.

Figure 3:
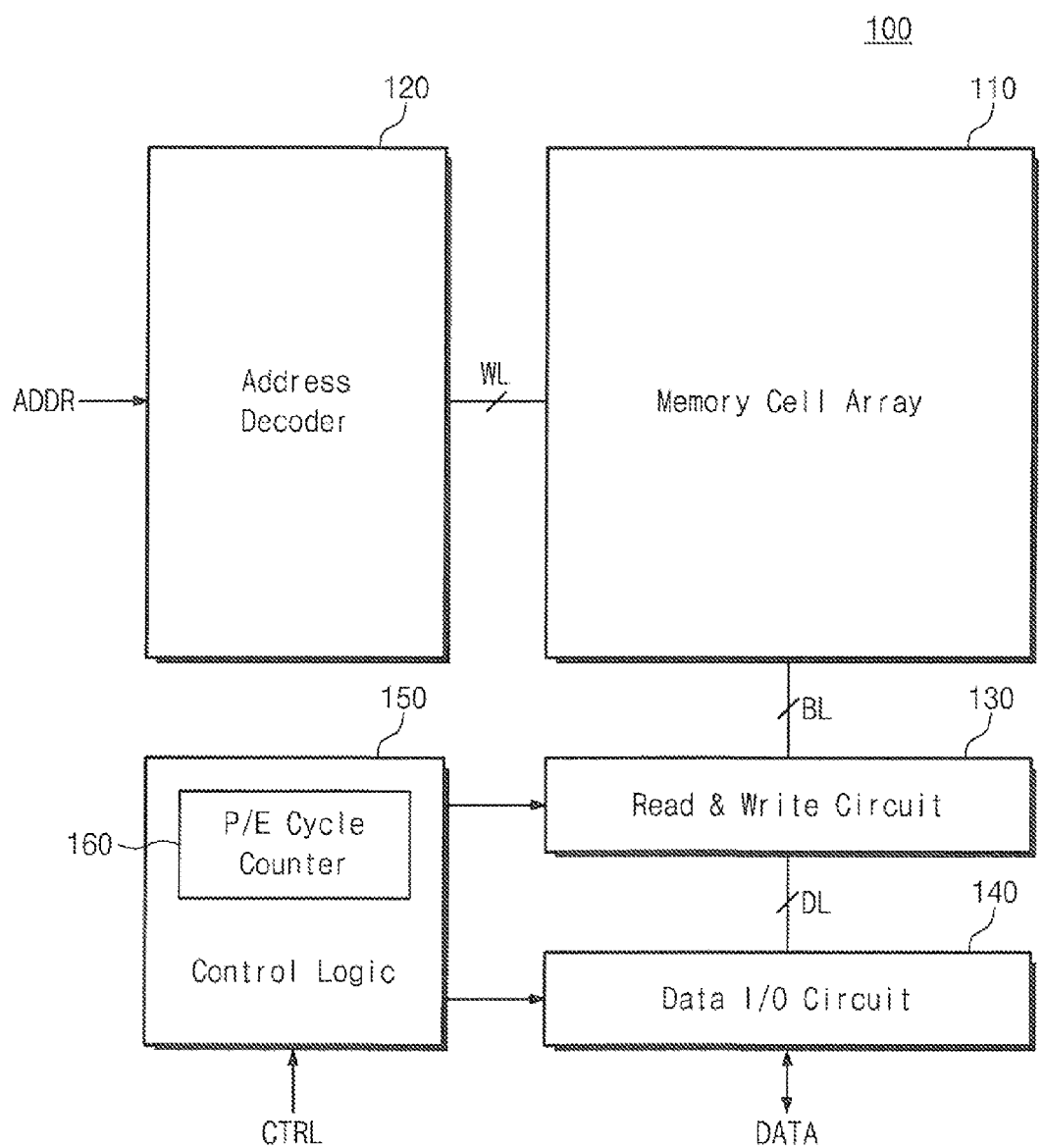
FIG. 3 is a block diagram of a nonvolatile memory device according to embodiments of the inventive concept.

FIG. 3 is a block diagram of a nonvolatile memory device 100 according to embodiments of the inventive concept. As illustrated, the nonvolatile memory device 100 includes a memory cell array 110, an address decoder 120, a read & write circuit 130, a data input/output (I/O) circuit 140, and a control logic 150. The memory cell array 110 is connected to the address decoder 120 through wordlines WL and connected to the read & write circuit 130 through bitlines BL. The memory cell array 110 includes a plurality of memory cells. As an example, memory cells arranged in a row direction are connected to wordlines WL, and memory cells arranged in a column direction are connected to bitlines BL. As an example, the memory cell array 110 is configured to store one or more bits per cell.

The address decoder 120 is connected to the memory cell array 110 through wordlines WL. The address decoder 120 is configured to operate in compliance with the control of the control logic 150. The address decoder 120 externally receives an address ADDR. The address decoder 120 is configured to decode a row address among the received address ADDR. The address decoder 120 selects wordlines WL by using the decoded row address ADDR. The address decoder 120 is configured to decode a column address among the received address ADDR. The decoded column address is transferred to the read & write circuit 130. As an example, the address decoder 120 includes well-known elements such as a row decoder, a column decoder, and an address buffer.

The read & write circuit 130 is connected to the memory cell array 110 through bitlines BL and connected to the data I/O circuit 140 through data lines DL. The read & write circuit 130 operates in compliance with the control of the control logic 150. The read & write circuit 130 is configured to receive a decoded column address from the address decoder 120. The read & write circuit 130 selects bitlines BL by using the decoded column address.

As an example, the read & write circuit 130 receives data from the data I/O circuit 140 and writes the received data into the memory cell array 110. The read & write circuit 130 reads out data from a first storage region of the memory cell array 110 and writes the read-out data into a second storage region of the memory cell array 110. As an example, the read & write circuit 130 is configured to perform a copy-back operation.

As an example, the read & write circuit 130 includes well-known elements such as a page buffer (or page register) and a column selection circuit. As another example, the read & write circuit 130 includes well-known elements such as a sense amplifier, a write driver, and a column selection circuit.

The data I/O circuit 140 is connected to the read & write circuit 130 through data lines DL. The data I/O circuit 140 operates in compliance with the control of the control logic 150. The data I/O circuit 140 is configured to exchange data DATA with art external entity. The data I/O circuit 140 is configured to transfer the external data DATA to the read & write circuit 130 through the data lines DL. The data I/O circuit 140 is configured to output the data DATA transferred through the data lines DL to the external entity. As an example, the data I/O circuit 140 includes well-known elements such as a data buffer.

The control logic 150 is connected to the address decoder 120, the read & write circuit 130, and the data I/O circuit 140. The control logic 150 is configured to control an overall operation of the nonvolatile memory device 100. The control logic 150 operates in response to an externally transferred control signal CTRL.

The control logic 150 includes a program/erase cycle counter 160, which is configured to count a program/erase cycle per memory block of the nonvolatile memory device 100. As an example, the program/erase cycle counter 160 is implemented in a digital circuit, an analog circuit or any combination thereof. As another example, the program/erase cycle counter 160 is implemented in software executed in the control logic 150. As further another example, the program/erase cycle 160 is implemented in combination of hardware and software.

Figure 4:
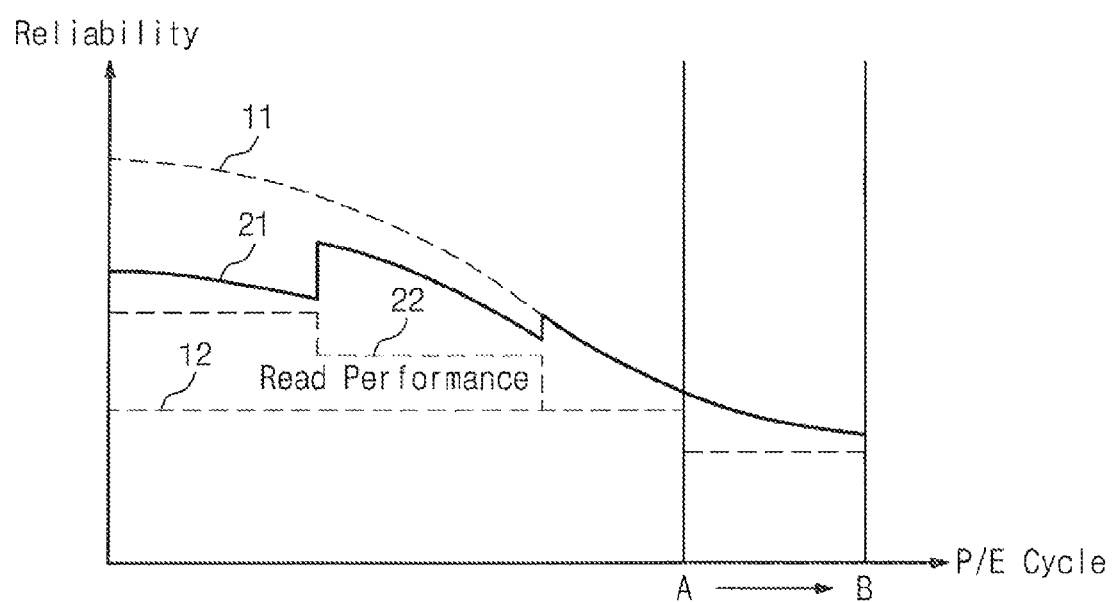
FIG. 4 is a graphic diagram illustrating an access method of a memory system according to the embodiments.

FIG. 4 is a graphic diagram illustrating an access method of a memory system according to embodiments of the inventive concept. Referring to FIG. 4, the access method is divided into a plurality of periods based on a program/erase cycle. According to embodiments of the inventive concept, a reliability improvement operation is selectively performed depending on a program/erase cycle. For instance, the reliability improvement operation is not performed when the program/operation cycle is small. On the other hand, the reliability improvement operation is performed when the program/operation cycle is great.

The term "reliability improvement operation" used herein means that read conditions are set to accurately read data stored in a memory cell in consideration of variation in characteristics of the memory cell. For instance, a reliability improvement operation may be a coupling compensation operation. The coupling compensation operation is an operation to set read conditions in consideration of an affect resulting from coupling between adjacent memory cells. However, since additional time is required to perform the reliability improvement operation, read performance is degraded by the reliability improvement operation.

According to embodiments of the inventive concept, a reliability improvement operation is not performed when a program/erase cycle is small. This is because reliability of a nonvolatile memory device is high when a program/erase cycle is small. Therefore, data may be accurately read without additionally performing a reliability improvement operation. As a result, speed of a read operation is enhanced because the reliability improvement operation is not performed when the program/erase cycle is small. On the other hand, a reliability improvement operation is performed when a program/erase cycle is great. This is because reliability of a nonvolatile memory device is relatively low when a program/erase cycle is great. Therefore, an additional reliability improvement operation is required to accurately read data. As a result, the reliability of a nonvolatile memory device is improved by performing the reliability improvement operation when the program/erase cycle is great.

Returning to FIG. 4, a reliability improvement operation is not performed because a program/erase cycle is small in the initial stage. Thus, read performance may be improved. As the program/erase cycle increases, an enhanced reliability improvement operation is performed. The enhanced reliability improvement operation allows the lifetime of a nonvolatile memory device to be extended. As can be seen in FIG. 4, due to the enhanced reliability improvement operation, read performance is lowered but limited lifetime is extended ("B"). While a plurality of periods have been described in this embodiment, it will be apparent to those skilled in the art that the scope of the inventive concept will not be limited thereto. The number of periods may vary randomly, and a reference program erase cycle classifying the respective periods may also vary randomly.

Figure 5:
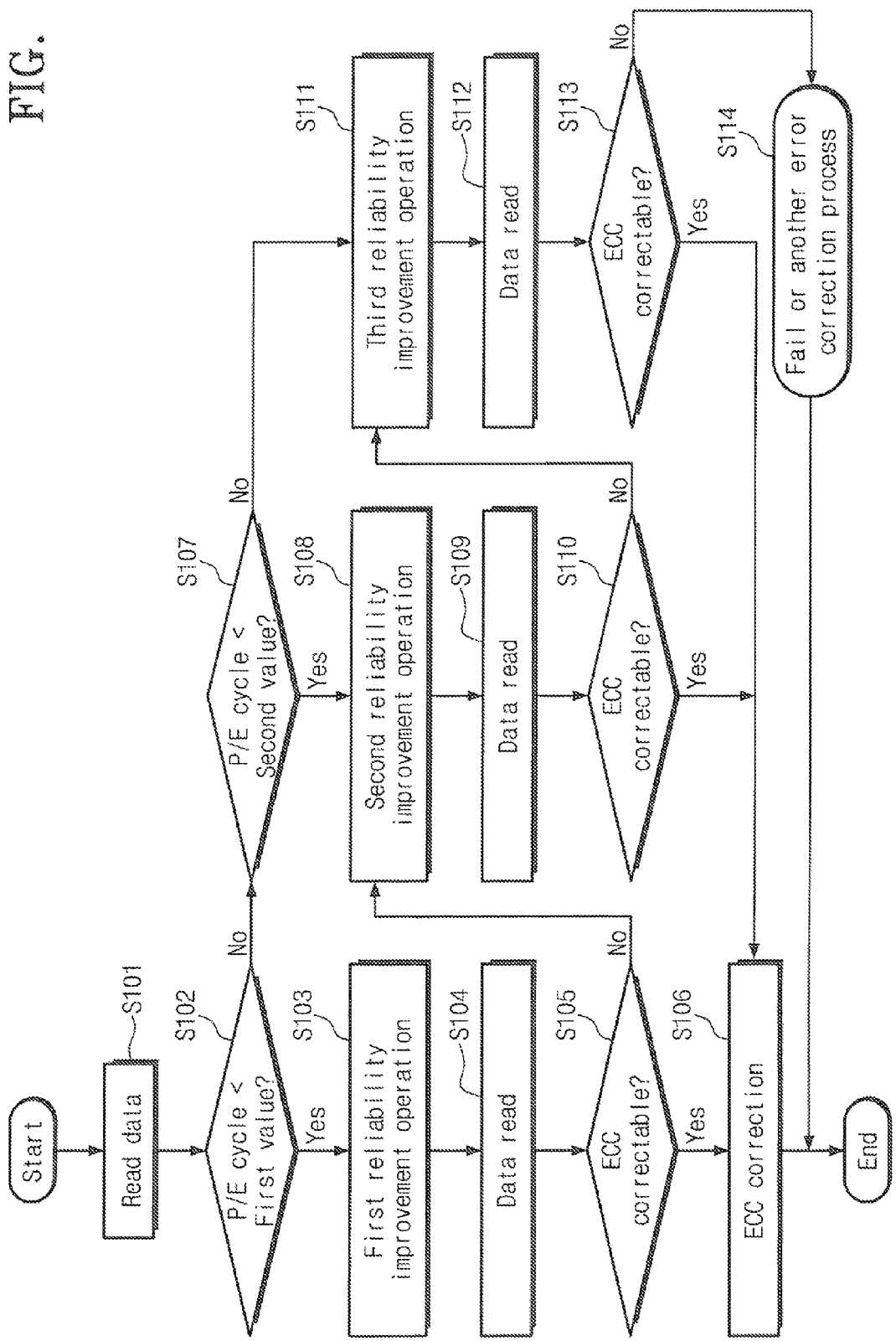
FIG. 5 is a flowchart illustrating an access operation of a memory system according to an embodiment of the inventive concept.

FIG. 5 is a flowchart illustrating an access operation of a memory system according to an embodiment of the inventive concept. When a read command is received from a host (S101), a logical address LBA and a sector size are extracted from the read command to determine whether a program/erase cycle of a corresponding memory block is less than a first reference (S102). If the program/erase cycle is less than the first reference, data and parity stored in a nonvolatile memory device are read out depending on read conditions decided by a first step of a reliability improvement operation (S104). An ECC engine detects whether a read error is correctable using the read-out data and parity (S105). If the read error is correctable, it is corrected (S106). When the read error is corrected, a read operation is completed. When the read error is not corrected, a second step of the reliability improvement operation is performed (S108).

If the program/erase cycle is not less than the first reference, it is determined whether the program/erase cycle is less than a second reference (S107). If the program/erase cycle is less than the second reference, the second step of the reliability improvement operation is performed (S108). Data and parity stored in the nonvolatile memory device are read out depending on read conditions decided by the second step of the reliability improvement operation (S109). The ECC engine detects whether the read error is connectable using the read-out data and parity (S110). If the read error is correctable, it is corrected (S106). When the read error is corrected, a read operation is completed. When the read error is not corrected, a third step of the reliability improvement operation is performed (S111).

If the program/erase cycle is not less than the second reference, the third step of the reliability improvement operation is performed (S111). Data and parity stored in the nonvolatile memory device are read out depending on read conditions decided by the third step of the reliability improvement operation (S112). The ECC engine detects whether the read error is correctable using the read-out data and parity (S113). If the read error is correctable, it is corrected (S106). When the read error is corrected, a read operation is completed. When the read error is not corrected, error correction is failed or another error correction operation may be performed (S114).

While a reliability improvement operation divided into first to third steps have been described in this embodiment, it will be apparent to those skilled in the art that the scope of the inventive concept is not limited thereto. The reliability improvement operation is not limited thereto and may be divided into various steps.

Figure 6:
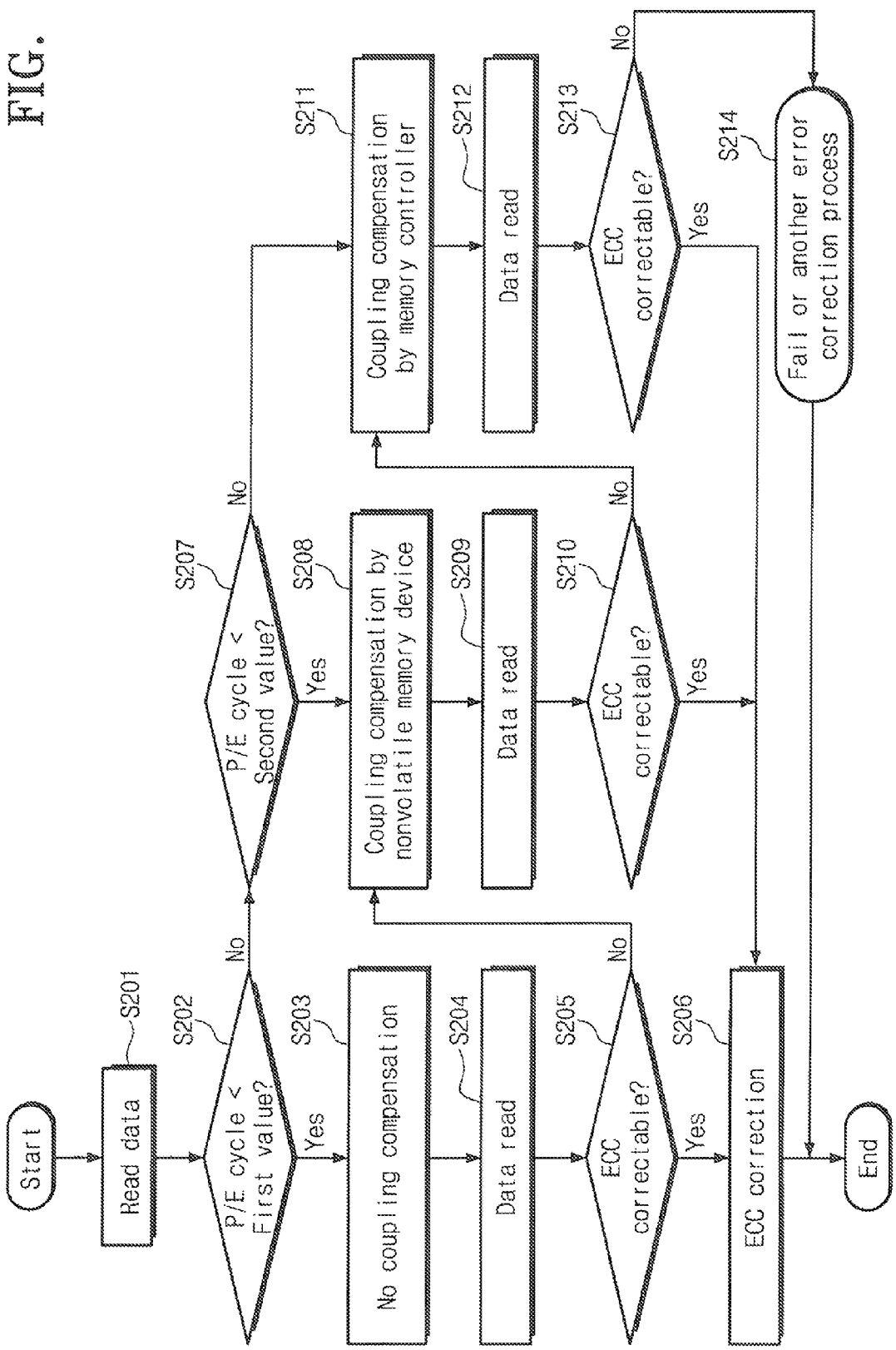
FIG. 6 is a flowchart illustrating an access operation of a memory system according to another embodiment of the inventive concept.

FIG. 6 is a flowchart illustrating an access operation of a memory system according to another embodiment of the inventive concept. In a first step of a reliability improvement operation, a read operation is performed while a coupling compensation function in a nonvolatile memory device is in an OFF state (S203). Reliability may be improved by a coupling compensation operation performed by the nonvolatile memory device. However, the coupling compensation operation results in a burden of reading even a memory cell of a peripheral page to delay read time. Accordingly, because reliability is high in the initial stage where a program/erase cycle is small, a coupling compensation function is not used.

In a second step of the reliability improvement operation, a read operation is performed while the coupling compensation function in the nonvolatile memory device is in an ON state (S208). The coupling compensation of the nonvolatile memory device is conducted to read not only a memory cell of a target page but also data stored in a memory cell of a peripheral page. Thus, an accurate value of the target page is read out. As the coupling compensation function in the nonvolatile memory device is laid in the ON state, reliability of the nonvolatile memory device is improved.

In a third step of the reliability improvement operation, a read operation is performed while the coupling compensation function in the nonvolatile memory device is in an OFF state and a coupling compensation function of a memory controller is in an ON state (S211). The coupling compensation by the memory controller may require more time because a value of a target page is analogized by reading not only memory cells of a peripheral page but also the whole block. However, the reliability of the nonvolatile memory device is significantly improved. While a reliability improvement operation divided into first to third steps has been described in this embodiment, it will be apparent to those skilled in the art that the inventive concept is not limited thereto.

Figure 7:
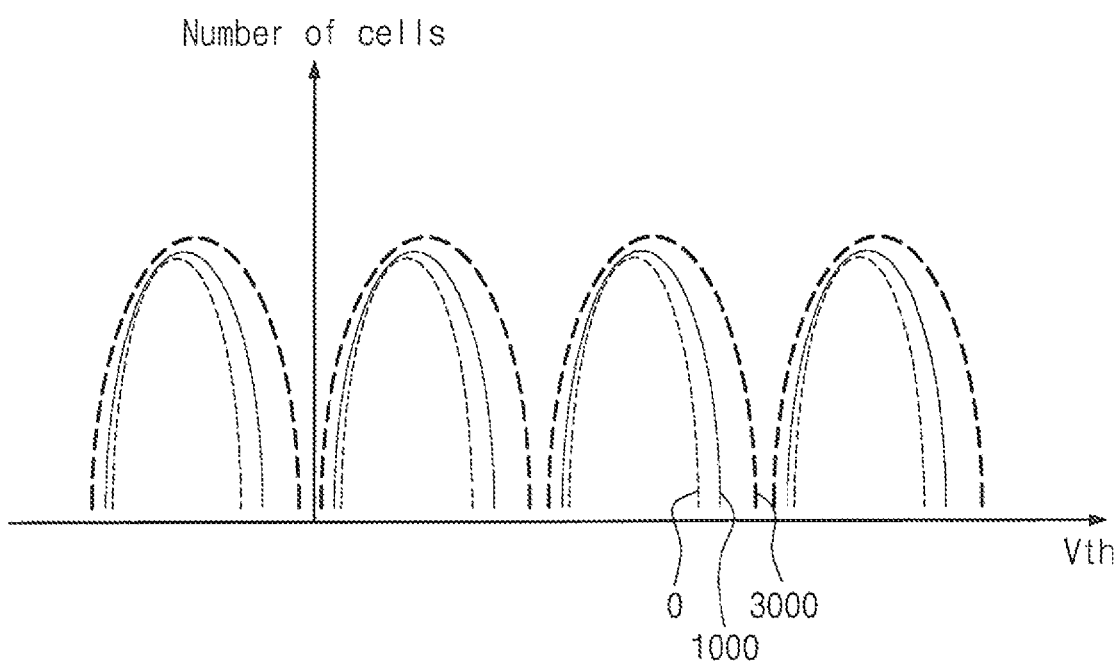
FIG. 7 is a graphic diagram illustrating a threshold voltage distribution of a memory cell depending on a program/erase cycle.
Figure 8:
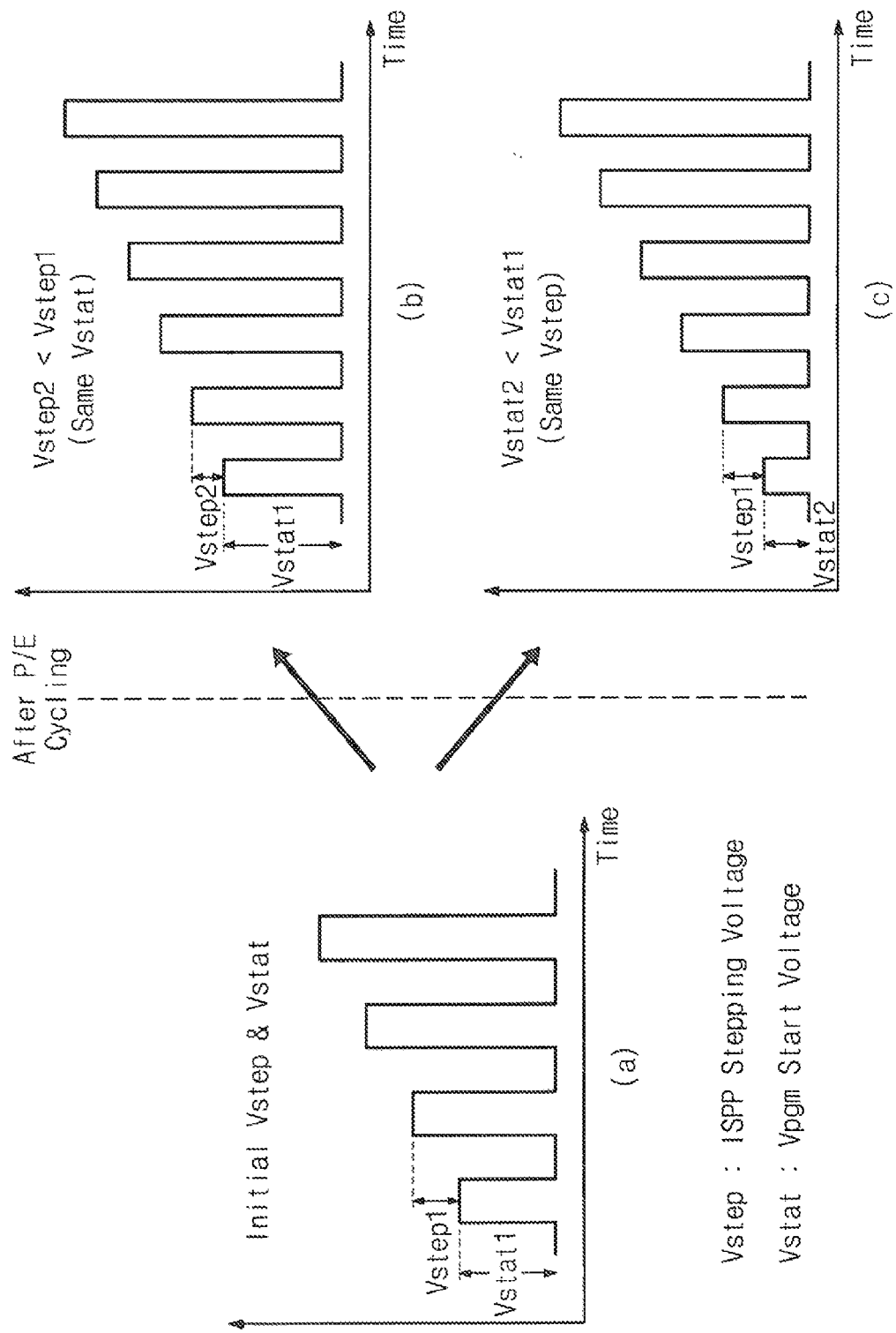
FIG. 8 is a graphic diagram showing that an error resulting from cell characteristics illustrated in FIG. 7 is prevented by changing an initial voltage and an ISPP stepping voltage of an ISPP voltage.

FIG. 7 is a graphic diagram illustrating a threshold voltage distribution of a memory cell depending on a program/erase cycle. Referring to FIG. 7, threshold voltage distribution characteristics become worse as a program/erase cycle increases from 0 to 3000. With the repetition of program/erase operations, physical characteristics may be degraded to trap electrons and prevent ejection of the trapped electrons. In addition, electrons may be ejected through an insulator. These characteristics may cause lots of errors when programming is conducted in an initial set manner. In FIG. 8, an initial voltage of an ISPP voltage and an ISPP stepping voltage may be changed to prevent an error resulting from the cell characteristics described in FIG. 7.

Figure 9:
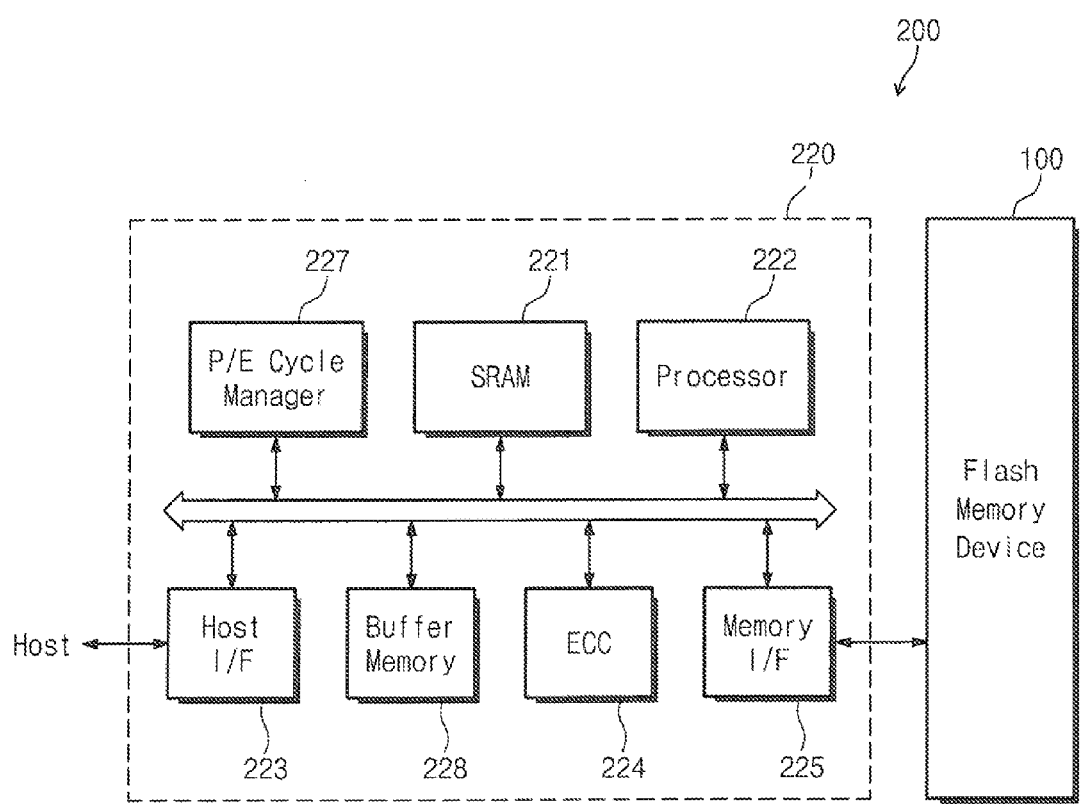
FIG. 9 is a block diagram of a memory system according to embodiments of the inventive concept.

FIG. 9 is a block diagram of a memory system 200 according to embodiments of the inventive concept. As illustrated, the memory system 200 includes a memory controller 220 and a nonvolatile memory device 100. The memory controller 220 includes a processor 222, an SRAM 221, a host interface 223, an ECC circuit 224, a memory interface 225, a bus 226, a program/erase cycle manager 227, and a buffer memory 228. The nonvolatile memory device 100 and the memory controller 220 may be incorporated in one storage device. The storage device includes portable storage devices such as a USB memory and memory cards (MMC, SD card, xD card, CF card, SIM card, etc.). Moreover, the storage device may be used in a host (not shown) such as a computer, a notebook computer, a digital camera, a mobile phone, an MP3 player, a portable multimedia player (PMP), and a game machine while being connected thereto.

The nonvolatile memory device 100 may perform an erase operation, a write operation or a read operation in compliance with the control of the memory controller 220. The memory interface 225 is used to transmit/receive a command, an address, and data to/from the nonvolatile memory device 100. That is, the memory interface 225 provides a read command and an address during a read operation and provides a write command, an address, and data during a write operation. The host interface 223 is used to receive a request for a write or read operation from a host or provide data in response to the request of the host.

The ECC circuit 224 generates a parity bit (or ECC data) using data transmitted to the nonvolatile memory device 100. The generated parity bit is stored in a spare area of the nonvolatile memory device 100. The ECC circuit 224 detects an error of data read out of the nonvolatile memory device 100. If the detected error lies within a correction range, the ECC circuit 224 corrects the detected error. According to a memory system, the ECC circuit 224 may be disposed inside or outside the memory controller 220.

The processor 222 is configured to control a read operation or a write operation of the nonvolatile memory device 100 in response to the request of the host. The buffer memory 228 may temporarily store data read out of the nonvolatile memory device 100 or data provided from the host. In addition, the buffer memory 222 may be used to drive firmware such as a flash translation layer (FTL). The FTL is operated by the processor 222. The buffer memory 228 may be configured using a DRAM or an SRAM.

The buffer memory 228 may store table information required to manage read error information. The table information is meta data, which is stored in a meta area of the nonvolatile memory device 100 under control of the processor 220. On power-up, the table information is copied to the buffer memory 228 from the meta area. Although not shown in the figures, the memory system 300 may further include a ROM (not shown) storing code data for interfacing with the host.

The memory system 200 according to an embodiment of the inventive concept may include a nonvolatile memory device 100 having an all bitline configuration and a memory controller 220 for controlling the nonvolatile memory device 100.

The nonvolatile memory device 100 may read a memory cell connected to an even bitline or an odd bitline while sensing a memory cell connected to an odd bitline or an even bitline. Moreover, the nonvolatile memory device 100 may perform a program operation in the unit of all bitlines and a read operation in the unit of an odd bitline or an even bitline.

In addition, depending on an operation mode, the nonvolatile memory device 100 performs a read operation in the unit of all bitlines or a read operation in the unit of an odd bitline or an even bitline. The operation mode may be decided through a read command, a mode register or a fuse option. The read command is provided from the memory controller 220. The mode register may be included in the nonvolatile memory device 100 or the memory controller 220.

The memory controller 220 may provide a column address for selecting an even bitline (or an odd bitline) after providing a column address for selecting an odd bitline (or an even bitline), during a read operation.

The program/erase cycle manager 227 decides a reliability improvement method to be applied to the nonvolatile memory device 100 in response to a program/erase cycle from the nonvolatile memory device 100. For example, the program/erase cycle manager 227 may apply an enhanced reliability improvement method to the nonvolatile memory device 100 when the program/erase cycle of the nonvolatile memory device 100 is great.

Figure 10:
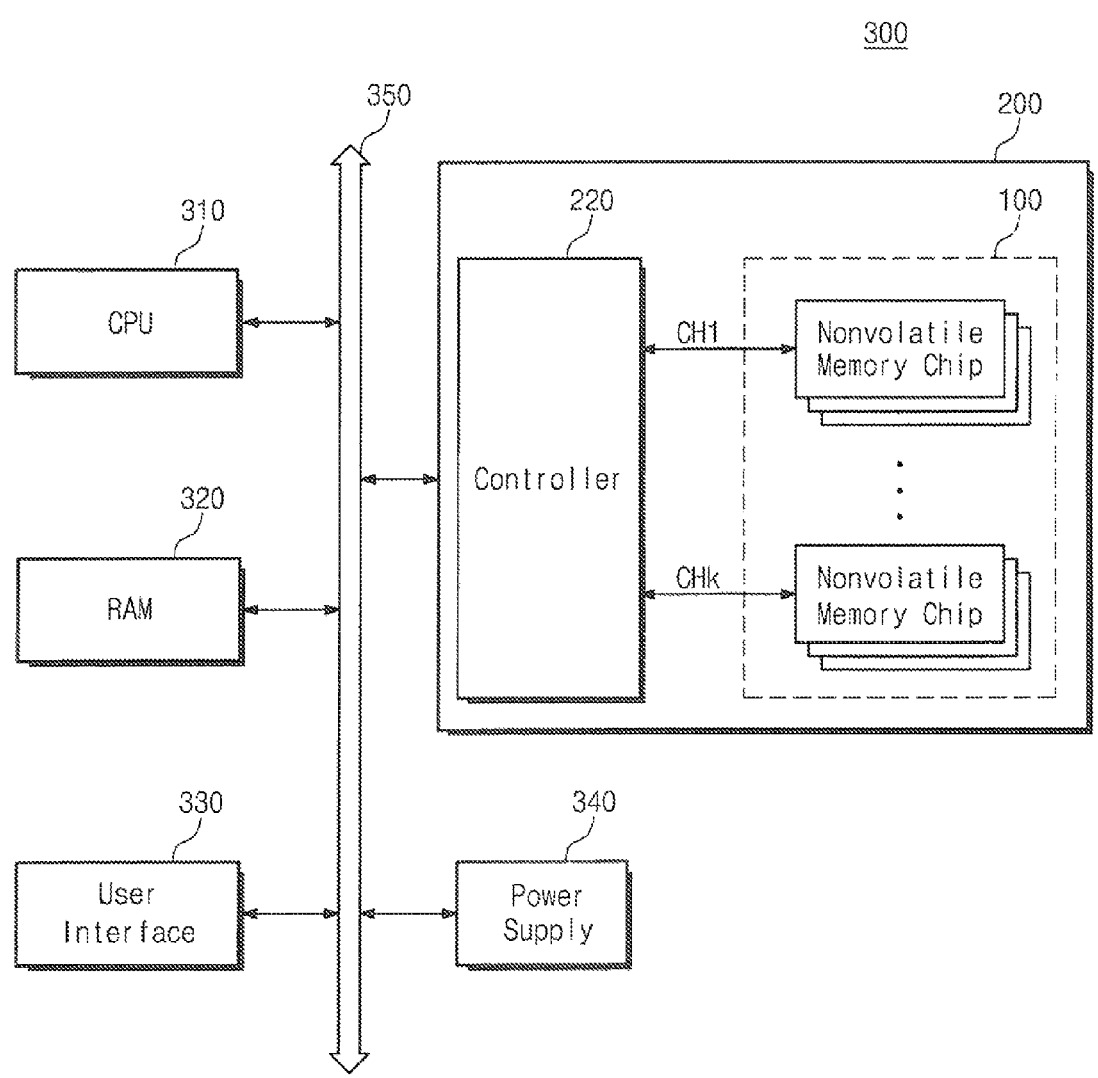
FIG. 10 is a block diagram of a computing system including the memory system shown in FIG. 9.

FIG. 10 is a block diagram of a computing system 300 including the memory system 200 shown in FIG. 9. As illustrated, the computing system 300 includes a central processing unit (CPU) 310, a random access memory (RAM) 320, a user interface 330, a power supply 340, and the memory system 200.

The memory system 200 is electrically connected to the CPU 310, the RAM 320, the user interface 330, and the power supply 340 through a system bus 350. Data provided through the user interface 330 or data processed by the CPU 310 is stored in the memory system 200. The memory system 200 includes a controller 220 and a nonvolatile memory device 100.

As shown in FIG. 10, the nonvolatile memory device 100 is connected to the system bus 350 through the memory controller 220. However, the nonvolatile memory device 100 may be configured to be directly connected to the system bus 350. In this case, the functions of the controller 220 described with reference to FIG. 9 are implemented by the processor 310.

The nonvolatile memory device 100 and/or the memory controller 220 may be mounted using various types of packages. For example, the nonvolatile memory device 100 and/or the memory controller 220 may be packaged using packages such as PoP (Package on Package). Ball grid arrays (BGAs), Chip scale packages (CSPs), Plastic Leaded Chip Carrier (PLCC), Plastic Dual in-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 11:
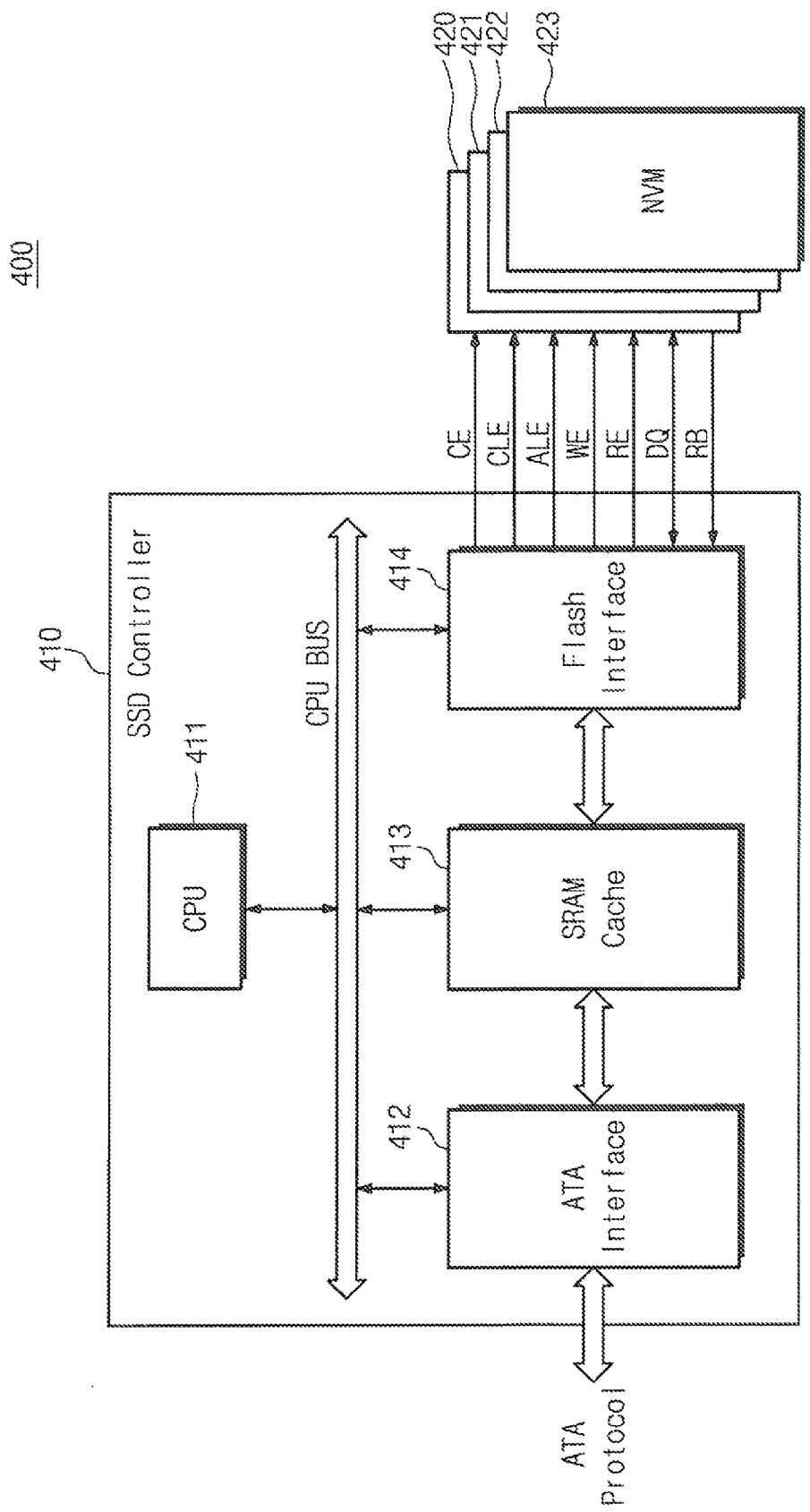
FIG. 11 is a block diagram illustrating a configuration of an SSD system including a nonvolatile memory device according to embodiments of the inventive concept.

FIG. 11 is a block diagram illustrating a configuration of an SSD system 400 including a nonvolatile memory device according to embodiments of the inventive concept. As illustrated, the SSD system includes an SSD controller 410 and nonvolatile memory devices 420-423.

A nonvolatile memory device according to embodiments of the inventive concept is applicable to a solid state disk (SSD). In recent years, SSD products are being spotlighted in the next-generation memory markets as competitive solutions capable of substituting hard disk drives (HDDs). SSDs are data storages using memory chips such as flash memories to store data, instead of spinning platters for use in typical hard disk drives. Generally, SSDs have advantages over HDDs, which operate mechanically, in operation rate, external impact and power consumption.

Returning to FIG. 11, a central processing unit (CPU) receives an instruction from a host, determining whether to store data from the host in a flash memory or to transmit data stored in the flash memory after reading the stored data. An ATA interface 412 exchanges data with a host side in compliance with the control of the CPU. The ATA interface 412 fetches an instruction and an address from the host side and transmits the fetched instruction and address to the CPU 211 through a CPU bus. Data input from the host through the ATA interface 412 or data to be transmitted to the host is transmitted to an SRAM cache 413 in compliance with the control of the CPU 411 without passing through the CPU bus. The ATA interface 412 includes a serial ATA (SATA) protocol and a parallel ATA (PATA) protocol.

The SRAM cache 413 is configured to temporarily store data transmitted between the host and the flash memories 420-423 and to store a program executed by the CPU 211. The SRAM cache 413 may be regarded as a kind of a buffer memory and does not necessarily include an SRAM. A flash interface 414 receives/transmits data from/to nonvolatile memories used as storage devices. The flash interface 414 may be configured to support a NAND flash memory, a One-NAND flash memory or a multi-level flash memory. A semiconductor memory system according to embodiments of the inventive concept may be used as a mobile storage device. Therefore, the semiconductor memory system may be used as a storage device for MP players, digital cameras, personal digital assistants (PDA), and e-books. Moreover, the semiconductor memory system may be used as a storage device for digital television sets or computers. As explained so far, according to embodiments of the inventive concept, read speed of a memory system is enhanced. In addition, lifespan of the memory system extends.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An access method of a memory system, comprising:
   comparing a number of erase cycles of a memory block corresponding to a read request to a first value;
   reading data stored in the memory block according to a first read condition corresponding to a first reliability improvement operation when the number of erase cycles of the memory block is less than the first value; and
   correcting an error of the data read according to the first read condition using an error correction code (ECC) when the error of the data read according to the first read condition is correctable.

2. The access method of claim 1, further comprising:
   reading the data stored in the memory block according to a second read condition corresponding to a second reliability improvement operation when the error of the data read according to the first read condition is not correctable; and
   correcting an error of the data read according to the second read condition using the error correction code (ECC) when the error of the data read according to the second read condition is correctable.

3. The access method of claim 2, wherein a first time to read the data stored in the memory block according to the first read condition is different from a second time to read the data stored in the memory block according to the second read condition.

4. The access method of claim 2, further comprising:
   reading the data stored in the memory block according to a third read condition corresponding to a third reliability improvement operation when the error of the data read according to the second read condition is not correctable; and
   correcting an error of data read according to the third read condition using the error correction code (ECC) when the error of the data read according to the third read condition is correctable.

5. The access method of claim 4, further comprising:
   performing a fail process or error correction process when the error of the data read according to the third read condition is not correctable.

6. An access method of a memory system, comprising:
   comparing a number of erase cycles of a memory block corresponding to a read request to a first value;
   reading data stored in the memory block according to a first read condition corresponding to a first reliability improvement operation when the number of erase cycles of the memory block is less than the first value;
   comparing the number of erase cycles of the memory block to a second value that is greater than the first value when the number of erase cycles of the memory block is greater than the first value;
   reading the data stored in the memory block according to a second read condition corresponding to a second reliability improvement operation when the number of erase cycles of the memory block is greater than the first value and less than the second value; and reading the data stored in the memory block according to a third read condition corresponding a third reliability improvement operation when the number of erase cycles of the memory block is greater than the second value.

7. The access method of claim 6, further comprising:
correcting an error of data read according to the first read condition using an error correction code (ECC) when the error of the data read according to the first read condition is correctable.

8. The access method of claim 7, further comprising:
reading the data stored in the memory block according to the second read condition corresponding to the second reliability improvement operation when the error of the data read according to the first read condition is not correctable.

9. The access method of claim 6, further comprising:
correcting an error of data read according to the second read condition using an error correction code (ECC) when the error of the data read according to the second read condition is correctable.

10. The access method of claim 9, further comprising:
reading the data stored in the memory block according to the third read condition corresponding to the third reliability improvement operation when the error of the data read according to the second read condition is not correctable.

11. The access method of claim 6, further comprising:
correcting an error of data read according to the third read condition using an error correction code (ECC) when the error of the data read according to the third read condition is correctable.

12. The access method of claim 11, further comprising:
performing a fail process or error correction process when the error of the data read according to the third read condition is not correctable.

13. The access method of claim 6, wherein a first time period to read the data stored in the memory block according to the first read condition, a second time period to read the data stored in the memory block according to the second read condition, and a third time period to read the data stored in the memory block according to the third read condition are different from one another.

14. A memory system, comprising:
a processor; and
a nonvolatile memory coupled to the processor and comprising computer readable program code embodied in the nonvolatile memory that when executed by the processor causes the processor to perform operations comprising:
comparing a number of erase cycles of a memory block corresponding to a read request to a first value;
reading data stored in the memory block according to a first read condition corresponding to a first reliability improvement operation when the number of erase cycles of the memory block is less than the first value; and
reading the data stored in the memory block according to a second read condition corresponding to a second reliability improvement operation when the error of the data read according to the first read condition is not correctable.

15. The memory system of claim 14, wherein the operations further comprise:
comparing the number of erase cycles of the memory block to a second value that is greater than the first value; and
reading the data stored in the memory block according to the second read condition when the number of erase cycles of the memory block is greater than the first value and less than the second value.

16. The memory system of claim 15, wherein the operations further comprise correcting an error of data read according to the second read condition using the error correction code (ECC) when the error of the data read according to the second read condition is correctable.

17. The memory system of claim 16, wherein the operations further comprise reading the data stored in the memory block according to a third read condition corresponding to a third reliability improvement operation when the error of the data read according to the second read condition is not correctable.

18. The memory system of claim 15, wherein the operations further comprise reading the data stored in the memory block according to a third read condition corresponding to a third reliability improvement operation when the number of erase cycles of the memory block is greater than the second value.

19. The memory system of claim 18, wherein the operations further comprise correcting an error of data read according to the third read condition using the error correction code (ECC) when the error of the data read according to the third read condition is correctable.

20. The memory system of claim 19, wherein the operations further comprise performing a fail process or error correction process when the error of the data read according to the third read condition is not correctable.

* * * * *